(12) United States Patent
Kong et al.

(10) Patent No.: US 11,121,318 B2
(45) Date of Patent: Sep. 14, 2021

(54) TUNABLE FORMING VOLTAGE FOR RRAM DEVICE

(71) Applicant: International Business Machines Corporation, Armonk, NY (US)

(72) Inventors: Dexin Kong, Guilderland, NY (US); Kangguo Cheng, Schenectady, NY (US); Juntao Li, Cohoes, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/776,333

(22) Filed: Jan. 29, 2020

(65) Prior Publication Data
US 2021/0234094 A1    Jul. 29, 2021

(51) Int. Cl.
*G11C 11/00* (2006.01)
*H01L 45/00* (2006.01)
*H01L 27/24* (2006.01)
*G11C 13/00* (2006.01)

(52) U.S. Cl.
CPC ........ *H01L 45/146* (2013.01); *G11C 13/0007* (2013.01); *G11C 13/0038* (2013.01); *G11C 13/0069* (2013.01); *H01L 27/2463* (2013.01); *H01L 45/08* (2013.01); *H01L 45/126* (2013.01); *H01L 45/1233* (2013.01); *H01L 45/1675* (2013.01); *G11C 2013/008* (2013.01); *G11C 2213/14* (2013.01); *G11C 2213/32* (2013.01); *G11C 2213/52* (2013.01)

(58) Field of Classification Search
CPC ............ G11C 13/0007; G11C 13/0038; G11C 13/0069; G11C 2013/008; G11C 2213/14; G11C 2213/32; G11C 2213/52
See application file for complete search history.

(56) References Cited

U.S. PATENT DOCUMENTS

| 7,221,579 B2 | 5/2007 | Krusin-Elbaum et al. |
| 7,724,562 B2 | 5/2010 | Meyer et al. |
| 7,804,704 B2 | 9/2010 | Sousa |

(Continued)

OTHER PUBLICATIONS

Young-Fisher et al., "Leakage Current-Forming Voltage Relation and Oxygen Gettering in HfOx RRAM Devices," IEEE Electron Device Letters, vol. 34, No. 6, pp. 750-752 (Jun. 2013).

(Continued)

*Primary Examiner* — Pho M Luu
(74) *Attorney, Agent, or Firm* — Robert Sullivan; Michael J. Chang, LLC (57) ABSTRACT

RRAM devices with tunable forming voltage are provided herein. A method of forming an RRAM device includes: depositing a first dielectric layer on a substrate; forming metal pads in the first dielectric layer; depositing a capping layer onto the first dielectric layer; forming heating elements in the capping layer in contact with the metal pads; forming an RRAM stack on the capping layer; patterning the RRAM stack into an RRAM cell(s) including a bottom electrode, a high-κ switching layer disposed on the bottom electrode, and a top electrode disposed on the high-κ switching layer; depositing a second dielectric layer over the RRAM cell(s); and forming a contact to the top electrode in the second dielectric layer. An RRAM device and a method of operating an RRAM device are also provided.

20 Claims, 11 Drawing Sheets

(56) References Cited

U.S. PATENT DOCUMENTS

| | | |
|---|---|---|
| 8,729,517 B2 | 5/2014 | Konno et al. |
| 9,053,781 B2 | 6/2015 | Tsai et al. |
| 9,209,392 B1 * | 12/2015 | Sung ...................... H01L 45/08 |
| 9,246,093 B2 | 1/2016 | Zanderighi et al. |
| 9,331,277 B2 * | 5/2016 | Chen ..................... H01L 45/085 |
| 9,577,009 B1 * | 2/2017 | Shih ..................... G11C 13/003 |
| 9,870,822 B2 | 1/2018 | Ge et al. |

OTHER PUBLICATIONS

Tapily et al., "Nanomechanical study of amorphous and polycrystalline ALD HfO2 thin films," Int. J. Surface Science and Engineering, vol. 5, Nos. 2/3, pp. 193-204 (Jul. 2011).

Van der Straten et al., "ALD and PVD Tantalum Nitride Barrier Resistivity and Their Significance in Via Resistance Trends," ECS trans., vol. 64, issue 9, pp. 117-122 (Oct. 2014).

Walczyk et al., "Impact of Temperature on the Resistive Switching Behavior of Embedded HfO2-Based RRAM Devices," IEEE Transactions on Electron Devices, vol. 58, No. 9, Sep. 2011, pp. 3124-3131.

\* cited by examiner

TUNABLE FORMING VOLTAGE FOR RRAM DEVICE

FIELD OF THE INVENTION

The present invention relates to resistive random access memory (RRAM) devices, and more particularly, to RRAM devices with tunable forming voltage.

BACKGROUND OF THE INVENTION

Resistive random access memory (RRAM) is a type of non-volatile memory. RRAM devices store information based on a resistance across a dielectric switching layer. The dielectric material of the switching layer is typically insulating. However, an applied voltage to the RRAM device is used to form an electrically-conductive path or filament through the switching layer.

The dielectric switching layer can be formed from a high-κ material. However, high-κ-based RRAM devices typically have a high forming voltage (e.g., from about 3 volts (V) to about 4 V and ranges therebetween) which makes the devices incompatible with advanced complementary metal oxide semiconductor (CMOS) technology (beyond 14 nanometer (nm) node technologies operating at less than 1V).

Thus, improved CMOS-compatible high-κ-based RRAM device designs would be desirable.

SUMMARY OF THE INVENTION

The present invention provides resistive random access memory (RRAM) devices with tunable forming voltage. In one aspect of the invention, a method of forming an RRAM device is provided. The method includes: depositing a first dielectric layer on a substrate; forming metal pads in the first dielectric layer over the substrate; depositing a capping layer onto the first dielectric layer, covering the metal pads; forming heating elements in the capping layer over and in contact with the metal pads; forming an RRAM stack on the capping layer including a bottom electrode layer disposed on the capping layer, a high-κ dielectric layer disposed on the bottom electrode layer, and a top electrode layer disposed on the high-κ dielectric layer; forming a patterned hardmask layer on the RRAM stack; patterning the RRAM stack into at least one RRAM cell on the capping layer using the patterned hardmask, the at least one RRAM cell including a bottom electrode, a high-κ switching layer disposed on the bottom electrode, and a top electrode disposed on the high-κ switching layer; depositing a second dielectric layer over the at least one RRAM cell; and forming a contact to the top electrode in the second dielectric layer.

In another aspect of the invention, an RRAM device is provided. The RRAM device includes: a first dielectric layer disposed on a substrate; metal pads formed in the first dielectric layer over the substrate; a capping layer disposed on the first dielectric layer, covering the metal pads; heating elements formed in the capping layer over and in contact with the metal pads; at least one RRAM cell on the capping layer, the at least one RRAM cell including a bottom electrode, a high-κ switching layer disposed on the bottom electrode, and a top electrode disposed on the high-κ switching layer; a second dielectric layer disposed over the at least one RRAM cell; and a contact to the top electrode formed in the second dielectric layer.

In yet another aspect of the invention, a method of operating an RRAM device is provided. The method includes: providing the RRAM device having a first dielectric layer disposed on a substrate; metal pads formed in the first dielectric layer over the substrate; a capping layer disposed on the first dielectric layer, covering the metal pads; heating elements formed in the capping layer over and in contact with the metal pads; at least one RRAM cell on the capping layer, the at least one RRAM cell including a bottom electrode, a high-κ switching layer disposed on the bottom electrode, and a top electrode disposed on the high-κ switching layer; a second dielectric layer disposed over the at least one RRAM cell; a contact to the top electrode formed in the second dielectric layer; applying a voltage to the heating elements to locally heat and crystallize the high-κ switching layer; and applying a programming voltage to the bottom electrode and the top electrode to program a resistance of the at least one RRAM cell.

A more complete understanding of the present invention, as well as further features and advantages of the present invention, will be obtained by reference to the following detailed description and drawings.

DETAILED DESCRIPTION OF PREFERRED EMBODIMENTS

The use of a high-κ dielectric for resistive random access memory (RRAM) devices advantageously provides quick switching times and good retention. However, as provided above, high-κ-based RRAM devices have a high forming voltage (the voltage needed to form an electrically-conductive path or filament through the dielectric element), e.g., of from about 3 volts (V) to about 4 V and ranges therebetween. Such a high forming voltage makes typical high-κ-based RRAM devices incompatible with advanced complementary metal oxide semiconductor (CMOS) technology (beyond 14 nanometer (nm) node technologies operating at less than 1V).

However, it has been found that with high-κ dielectrics such as hafnium oxide (HfO₂) the degree of crystallinity of the material affects the forming voltage. Namely, the higher the crystallinity, the lower the forming voltage. See, for example, Young-Fisher et al., "Leakage Current-Forming Voltage Relation and Oxygen Gettering in HfOx RRAM Devices," IEEE Electron Device Letters, vol. 34, no. 6, pp. 750-752 (June 2013), the contents of which are incorporated by reference as if fully set forth herein. Namely, a higher crystallinity in a HfO₂ material (more grains) causes leakage current to increase, which means that to achieve the same leakage current the required forming voltage is lower. Therefore, a HfO₂ film with more grains has a lower forming voltage. Initially, the as-deposited HfO₂ film is amorphous. Thermal treatment can poly-crystallize the film (more grains), see Tapily, described below. The instant techniques leverage this concept to lower the forming voltage (e.g., to less than about 1 volt (V)) by crystallizing the switching layer by introducing local thermal treatment.

Further, CMOS compatibility requires that processing temperatures remain within the thermal budget. For instance, back-end-of-line (BEOL) processing temperatures should generally not exceed 400° C. While temperatures in excess of 400° C. are needed to crystallize the high-κ switching layer material, it has been found herein that localized high-temperature annealing via local (resistive) heating elements (rather than a global anneal) can be used to crystallize the switching layer and lower the forming voltage without affecting any other device components. A resistive heating element generates heat using joule heating based on an applied voltage.

Further, the present techniques advantageously provide the opportunity to tune the forming voltage of the high-κ switching layer so that the present RRAM devices can adapt to different CMOS technologies (with different Vdd). Also, the present techniques provide a solution to issues of non-uniformity of forming voltage by tuning the heating budget for individual RRAM cells via the heating elements local to each of the cells.

With high-κ switching layer materials such as HfO₂, temperatures as high as about 600° C. can be needed to crystallize amorphous HfO₂. See, for example, Tapily et al., "Nanomechanical study of amorphous and polycrystalline ALD HfO₂ thin films," Int. J. Surface Science and Engineering, vol. 5, nos. 2/3, pp. 193-204 (July 2011) (referred to herein as "Tapily"), the contents of which are incorporated by reference as if fully set forth herein. Thus, for a given operating voltage applied to the local heating elements (e.g., a 1 volt (V) operating voltage), the pulse duration needed to raise the temperature of the local heating elements to 600° C. can be determined as follows:

$$R = \rho * L / A \quad (1)$$

$$P = V^2 / R \quad (2)$$

$$\text{Energy} = P^* \tau = M^* C^* \Delta T = \rho' * A^* L^* C^* \Delta T \quad (3)$$

$$V^2 * A * \frac{\tau}{\rho * L} = \rho' * A * L * C * \Delta T, \quad (4)$$

wherein R, ρ, L and A are the resistance, resistivity, length, and area, respectively, of the local heating elements, P is the electric power, V is the operating voltage, τ is the pulse duration time, ρ' is the material density of bulk tantalum nitride (TaN), T is temperature, M is mass, and C is specific heat. From Equations 1-4 it is determined that:

$$V^2 * \tau = \rho * \rho'^* L^2 * C * \Delta T. \quad (5)$$

As will be described in detail below, the present RRAM devices can employ materials such as tantalum nitride (TaN) to form the local (resistive) heating elements. The resistivity R of TaN is from about 240 microhm centimeter (μΩcm) to about 5000 μΩcm. See, for example, van der Straten et al., "ALD and PVD Tantalum Nitride Barrier Resistivity and Their Significance in Via Resistance Trends," ECS trans., vol. 64, issue 9, pp. 117-122 (October 2014), the contents of which are incorporated by reference as if fully set forth herein. Thus, by way of example only, given the exemplary, non-limiting values of ρ~1×10⁻⁵ Ohm*m, ρ'=1.4×10⁴ kg/m³, L~100 nm=1×10⁻⁷ m, C=205 J/(kg*K), and ΔT~600K, then V²*τ~1.8×10⁻¹⁰~0.2V²*ns. Namely, for a 1V operation voltage, a pulse duration time τ~0.2 nanoseconds (ns) is needed to raise the temperature of the local heating elements to 600° C.

Figure 1:
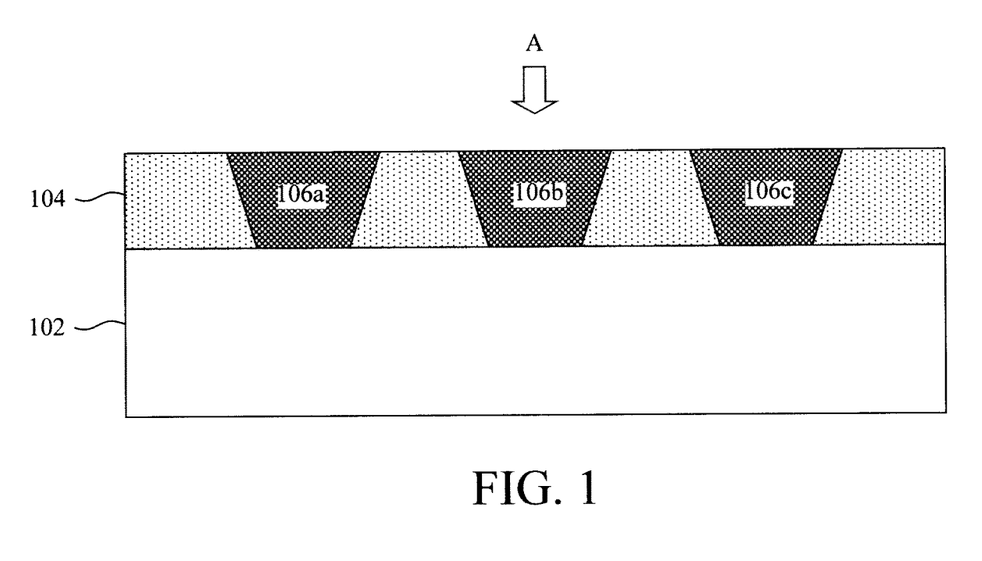
FIG. 1 is a cross-sectional diagram illustrating a dielectric layer having been formed on a substrate, and metal pads having been formed in the dielectric layer according to an embodiment of the present invention.

Given the above overview of the present techniques, an exemplary methodology for forming an RRAM device is now described by way of reference to FIGS. 1-16. As shown in FIG. 1, the process begins with the formation of a dielectric layer 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Suitable materials for dielectric layer 104 include, but are not limited to, nitride materials such as silicon nitride (SiN) and/or silicon carbon nitride (SiCN), and/or oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD) or physical vapor deposition (PVD) can be employed to deposit the dielectric layer 104 onto substrate 102. According to an exemplary embodiment, dielectric layer 104 has a thickness of from about 5 nanometers (nm) to about 15 nm and ranges therebetween.

As shown in FIG. 1, metal pads 106a,b,c are then formed in dielectric layer 104 over the substrate 102. To form metal pads 106a,b,c in dielectric layer 104, standard lithography and etching techniques are used to first pattern features (vias and/or trenches) in dielectric layer 104. The features are then filled with a contact metal (or combination of metals) to form the metal pads 106a,b,c. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying dielectric layer 104. The hardmask is then removed. A directional (anisotropic) etching process such as reactive ion etching (RIE) can be employed for patterning the features in dielectric layer 104, with substrate 102 acting as an etch stop.

Suitable contact metals include, but are not limited to, copper (Cu), tungsten (W), ruthenium (Ru), cobalt (Co), nickel (Ni) and/or platinum (Pt). The contact metal(s) can be deposited into the features using a process such as evaporation, sputtering, or electrochemical plating. Following deposition, the metal overburden can be removed using a process such as chemical-mechanical polishing (CMP). Prior to depositing the contact metal(s) into the features, a conformal barrier layer (not shown) can be deposited into and lining the features. Use of such a barrier layer helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the features prior to contact metal deposition. A seed layer facilitates plating of the contact metal into the features.

Figure 2:
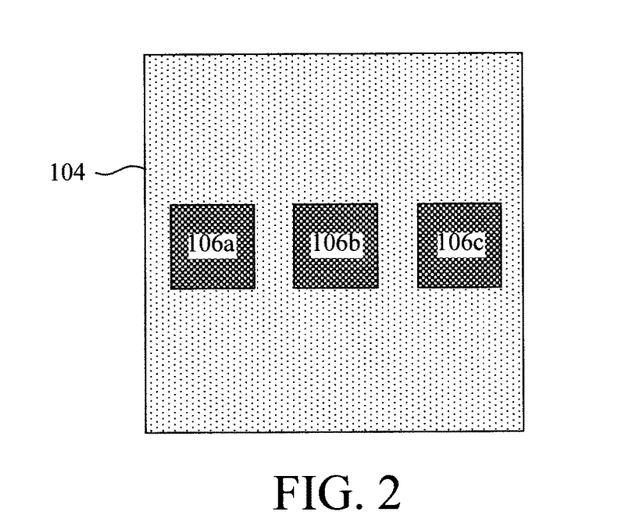
FIG. 2 is a top-down diagram illustrating the metal pads having been formed in the dielectric layer according to an embodiment of the present invention.
Figure 3:
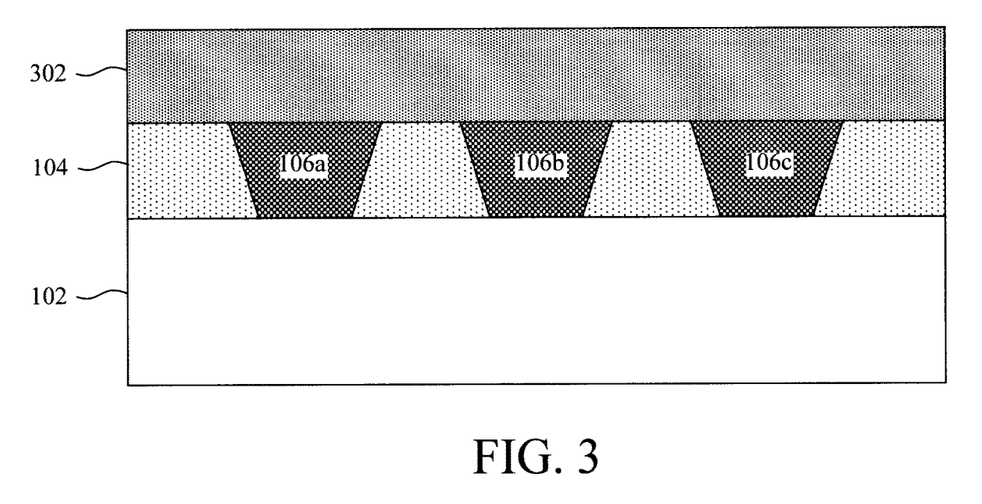
FIG. 3 is a cross-sectional diagram illustrating a capping layer having been formed on the dielectric layer covering/capping the metal pads according to an embodiment of the present invention.

FIG. 2 is a diagram providing a top-down view of the device structure, e.g., from viewpoint A (see FIG. 1). As shown in FIG. 2, metal pads 106a,b,c are surrounded by dielectric layer 104. Further, metal pads 106a,b,c all have approximately the same footprint and are located adjacent to one another in dielectric layer 104. As will be described in detail below, this side-by-side arrangement of the metal pads 106a,b,c will facilitate localized heating of the high-κ switching layer that will be formed over the metal pads 106a,b,c/bottom electrode (see below).

A capping layer 302 is then formed on the dielectric layer 104 covering/capping the metal pads 106a,b,c. See FIG. 3. Suitable materials for the capping layer 302 include, but are not limited to, nitride materials such as SiN and/or SiCN. A process such as CVD, ALD or PVD can be employed to deposit the capping layer 302 onto dielectric layer 104. According to an exemplary embodiment, capping layer 302 has a thickness of from about 5 nm to about 15 nm and ranges therebetween. Following deposition, the capping layer 302 can be planarized using a process such as CMP.

Heating elements 402a,b,c are then formed in capping layer 302 over and in direct contact with metal pads 106a,b,c, respectively. See FIG. 4. To form heating elements 402a,b,c in capping layer 302, standard lithography and etching techniques (see above) are used to first pattern features (vias and/or trenches) in capping layer 302. The features are then filled with a high resistivity metal. Suitable high resistivity metals include, but are not limited to, titanium nitride (TiN) and/or tantalum nitride (TaN). A process such as CVD, ALD or PVD can be employed to deposit the high resistivity metal into the features. Following deposition, the metal overburden can be removed using a process such as CMP, stopping on the capping layer 302.

Figure 4:
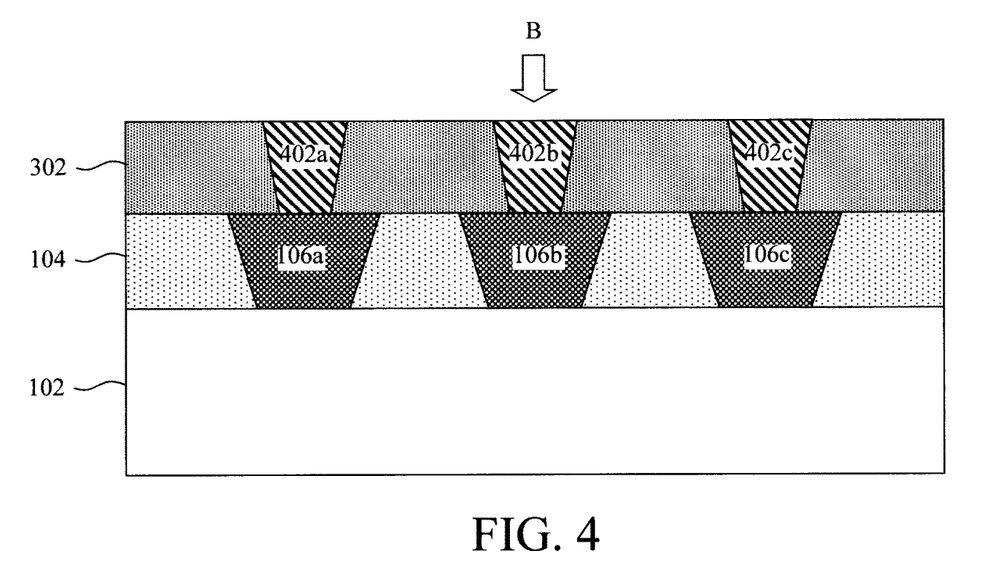
FIG. 4 is a cross-sectional diagram illustrating heating elements having been formed in the capping layer over and in direct contact with the metal pads according to an embodiment of the present invention.
Figure 5:
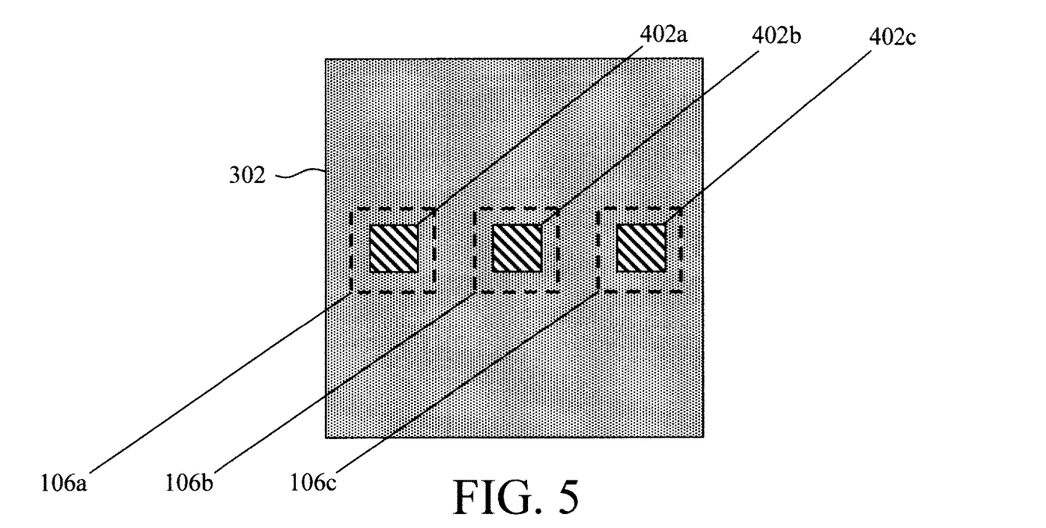
FIG. 5 is a top-down diagram illustrating heating elements having been formed in the capping layer over the metal pads according to an embodiment of the present invention.
Figure 6:
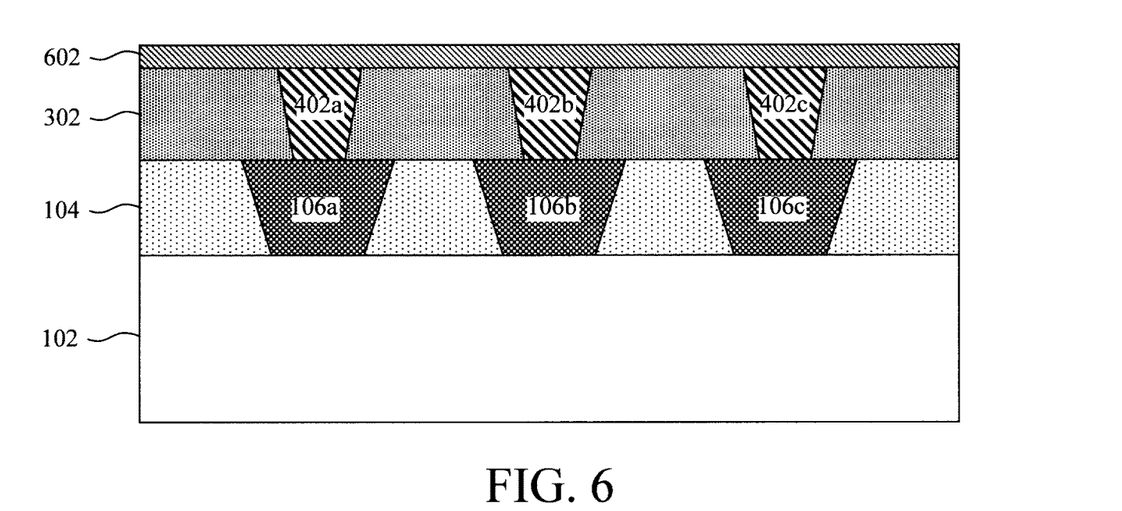
FIG. 6 is a cross-sectional diagram illustrating a bottom electrode layer having been deposited onto the capping layer over and in direct contact with the heating elements according to an embodiment of the present invention.

FIG. 5 is a diagram providing a top-down view of the device structure, e.g., from viewpoint B (see FIG. 4). In FIG. 5, dotted lines are used to represent the metal pads 106a,b,c, which are now present beneath the capping layer 302. As shown in FIG. 5, according to an exemplary embodiment heating elements 402a,b,c are centered over metal pads 106a,b,c. As also shown in FIG. 5, according to an exemplary embodiment heating elements 402a,b,c have a smaller footprint than the underlying metal pads 106a,b,c.

An RRAM stack is then formed on the capping layer 302. To form the RRAM stack, a bottom electrode layer 602 is first deposited onto the capping layer 302 over and in direct contact with the heating elements 402a,b,c. See FIG. 6. Suitable materials for the bottom electrode layer 602 include, but are not limited to, TiN having a titanium (Ti)/nitrogen (N) ratio of less than or equal to (≤) 1, TaN, tungsten (W) and/or noble metals such as platinum (Pt), iridium (Ir) and/or ruthenium (Ru). A process such as CVD, ALD or PVD can be employed to deposit the bottom electrode layer 602 onto capping layer 302. According to an exemplary embodiment, bottom electrode layer 602 has a thickness of from about 1 nm to about 5 nm and ranges therebetween. In one exemplary embodiment, the bottom electrode layer 602 is formed from a high resistivity metal. As provided above, suitable high resistivity metals include, but are not limited to, TiN and/or TaN. In that case, the thickness of the bottom electrode layer 602 can be adjusted based on the resistive heating requirements (see above equations which take into account resistivity of the material, as well as the heating element dimensions). Optionally, the bottom electrode layer 602 can be formed from the same high resistivity metal (or the same combination of high resistivity metals) as the heating elements 402a,b,c.

A high-κ dielectric layer 702 is then deposited onto the bottom electrode layer 602. See FIG. 7. The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ dielectric materials for layer 702 include, but are not limited to, hafnium oxide ($HfO_2$), lanthanum oxide ($LaO_2$) and/or strontium titanate ($SrTiO_3$). A process such as CVD, ALD or PVD can be employed to deposit the high-κ dielectric layer 702 onto bottom electrode layer 602. According to an exemplary embodiment, high-κ dielectric layer 702 has a thickness of from about 1 nm to about 3 nm and ranges therebetween.

Figure 7:
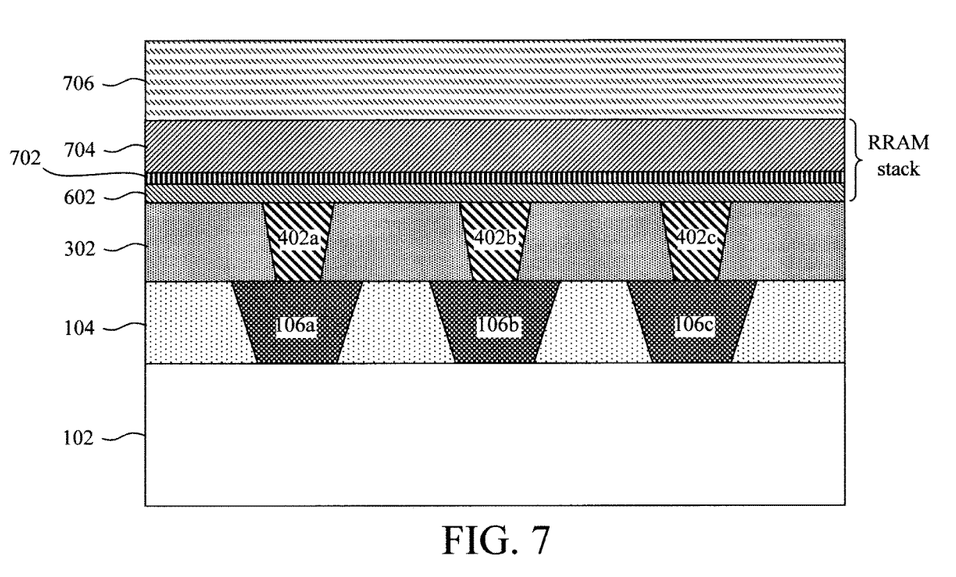
FIG. 7 is a cross-sectional diagram illustrating a high-κ dielectric layer having been deposited onto the bottom electrode layer, a top electrode layer having been deposited onto the high-κ dielectric layer to complete an RRAM stack, and a hardmask layer having been deposited onto the RRAM stack according to an embodiment of the present invention.

A top electrode layer 704 is then deposited onto the high-κ dielectric layer 702. Suitable materials for top electrode layer 704 include, but are not limited to, TiN having a titanium to nitrogen (Ti/N) ratio of greater than (>) 1, Ti-containing alloys (such as TiN and/or tungsten titanium (TiW)) and/or aluminum (Al)-containing alloys (such as titanium aluminum carbide (TiAlC)). A process such as CVD, ALD or PVD can be employed to deposit the top electrode layer 704 onto high-κ dielectric layer 702. According to an exemplary embodiment, top electrode layer 704 has the thickness of from about 10 nm to about 20 nm and ranges therebetween. Deposition of the top electrode layer 704 completes the RRAM stack.

A hardmask layer 706 is then deposited onto the RRAM stack (i.e., hardmask layer 706 is deposited onto top electrode layer 704 of the RRAM stack). Suitable materials for hardmask layer 706 include, but are not limited to, nitride materials such as SiN, silicon oxynitride (SiON), silicon carbide nitride (SiCN), and/or oxide materials such as silicon oxide (SiOx). A process such as CVD, ALD or PVD can be employed to deposit the hardmask layer 706 onto the RRAM stack. According to an exemplary embodiment, hardmask layer 706 has the thickness of from about 15 nm to about 30 nm and ranges therebetween.

Figure 8:
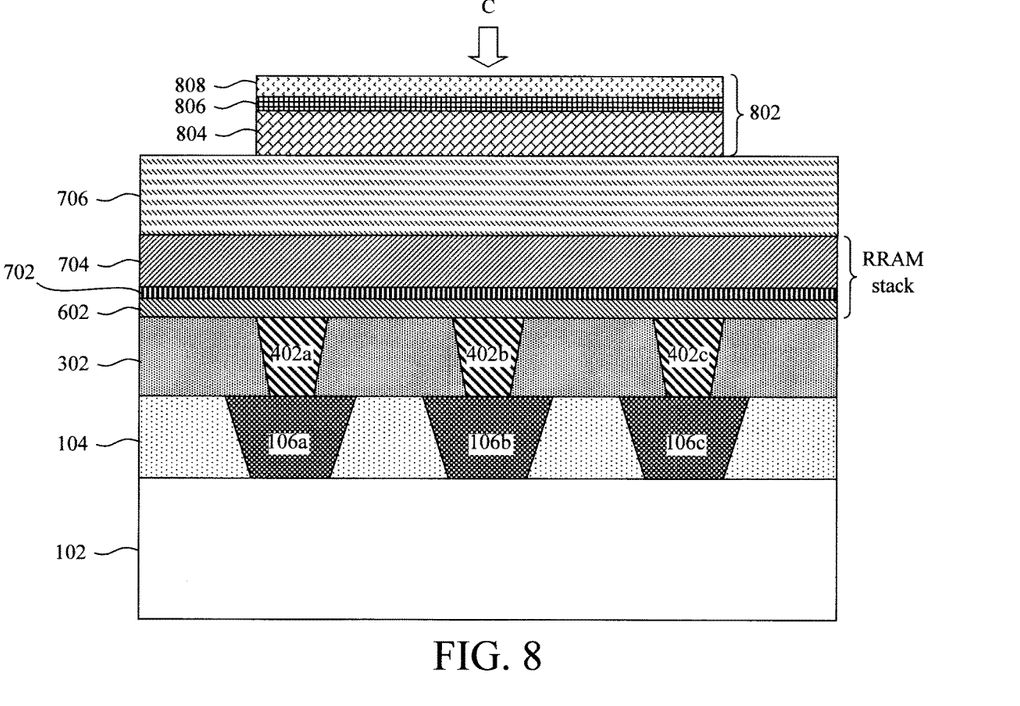
FIG. 8 is a cross-sectional diagram illustrating a patterned lithographic stack having been formed on the hardmask layer marking the footprint and location of at least one individual RRAM cell according to an embodiment of the present invention.

Hardmask layer 706 will be used to pattern the RRAM stack into at least one individual RRAM cell. To do so, as shown in FIG. 8 a patterned lithographic stack 802 is formed on the hardmask layer 706 marking the footprint and location of at least one individual RRAM cell. According to an exemplary embodiment, lithographic stack 802 includes an OPL 804 disposed on the hardmask layer 706, an ARC 806 disposed on the OPL, and a photoresist 808 disposed on the ARC 806.

A casting process such as spin-coating or spray coating can be employed to deposit the OPL 804 onto hardmask layer 706. According to an exemplary embodiment, OPL 804 has a thickness of from about 10 nm to about 30 nm and ranges therebetween. A process such as CVD, PVD or spin-coating can be employed to deposit ARC 806 onto the OPL 804. According to an exemplary embodiment, ARC 806 has a thickness of from about 5 nm to about 10 nm and ranges therebetween. A casting process such as spin-coating or spray coating can be employed to deposit photoresist 808 onto the ARC 806. According to an exemplary embodiment, photoresist 808 has a thickness of from about 5 nm to about 10 nm and ranges therebetween.

An exposure and development process is used to pattern the photoresist 808. As shown in FIG. 8, the pattern from photoresist 808 is then transferred to the underlying ARC 806 and OPL 804. For instance, following a post-apply bake to remove excess solvent, the as-deposited photoresist material is exposed to light. Typically, exposure of the photoresist material is performed using a patterned mask such that the photoresist material is only exposed to the light in the unmasked regions. Following exposure, a post-exposure bake can be performed to accelerate the exposure reaction. The photoresist material is then contacted with a developer solution to remove the exposed or non-exposed portions of the photoresist material, in the case of a positive photoresist or a negative photoresist, respectively, to form the patterned photoresist 808 shown in FIG. 8. A directional (anisotropic) dry or wet etching process (or combination of etching processes) can then be employed to transfer the pattern from photoresist 808 to the underlying ARC 806 and OPL 804, to form the lithographic stack 802 shown in FIG. 8.

Figure 9:
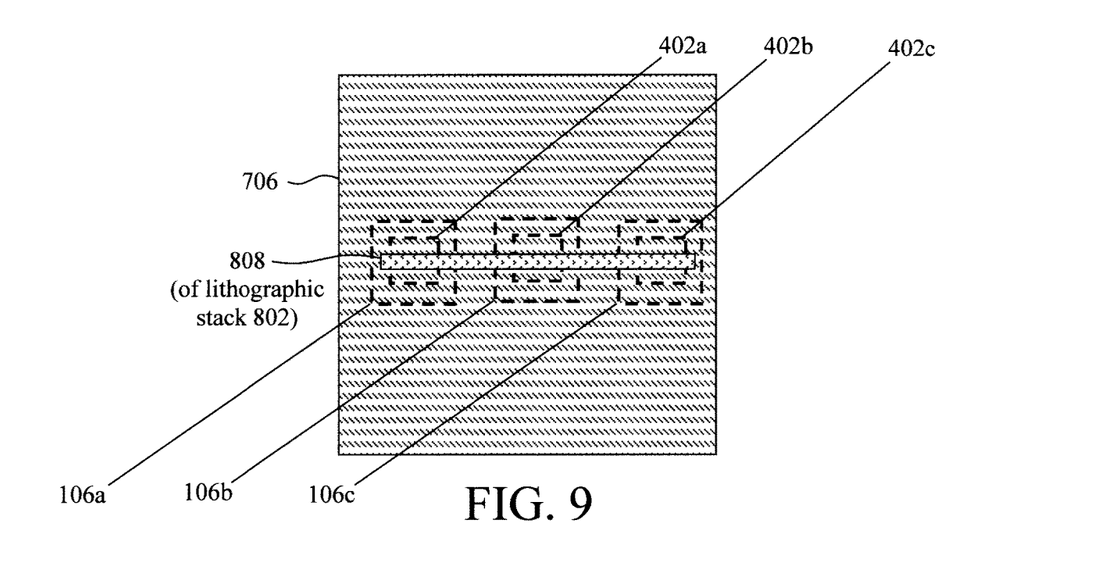
FIG. 9 is a top-down diagram illustrating the patterned lithographic stack having been formed on the hardmask layer marking the footprint and location of at least one individual RRAM cell that will be patterned in the underlying RRAM stack according to an embodiment of the present invention.

FIG. 9 is a diagram providing a top-down view of the device structure, e.g., from viewpoint C (see FIG. 8). In FIG. 9, dotted lines are used to represent the metal pads 106a,b,c, and heating elements 402a,b,c which are now present beneath the lithographic stack 802. As shown in FIG. 9, lithographic stack 802 (only the top layer, i.e., photoresist 808, of which is visible in this top-down view) covers a portion of the hardmask layer 706 corresponding to the footprint and location of an individual RRAM cell that will be patterned in the underlying RRAM stack.

The pattern from lithographic stack 802 is then transferred to hardmask layer 706, after which the OPL 804, ARC 806, and any remaining photoresist 808 are removed. See FIG. 10. According to an exemplary embodiment, hardmask layer 706 is patterned using a directional (anisotropic) etching process such as reactive ion etching (RIE). The as-patterned hardmask layer is now given the reference numeral 706a. OPL 804 can be removed using a process such as plasma ashing. ARC 806 can be removed using any commercially-available ARC remover. Photoresist 808 can be removed using a suitable solvent such as 1-methyl-2-pyrrolidone (NMP) or any other commercially-available photoresist remover.

Figure 10:
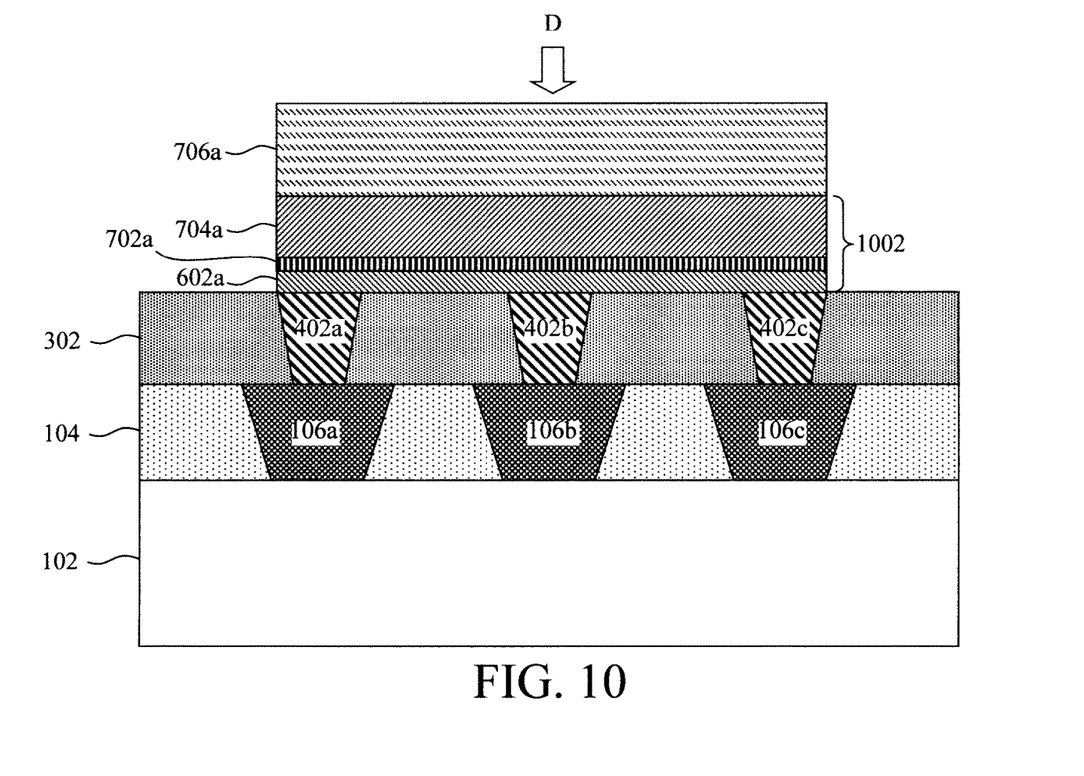
FIG. 10 is a cross-sectional diagram illustrating the pattern from lithographic stack having been transferred to the hardmask layer, and the pattern from hardmask layer having been transferred to the underlying RRAM stack to form at least one individual RRAM cell having a bottom electrode, high-κ switching layer, and a top electrode according to an embodiment of the present invention.

As shown in FIG. 10, the pattern from hardmask 706a is then transferred to the underlying RRAM stack (i.e., bottom electrode layer 602, high-κ dielectric layer 702 and top electrode layer 704) to form at least one individual RRAM cell 1002 including bottom electrode 602a, high-κ switching layer 702a and top electrode 704a, respectively. According to an exemplary embodiment, a directional (anisotropic) etching process such as RIE (or a series of RIE steps) is used to transfer the pattern from hardmask 706a to the RRAM stack. Following patterning of RRAM cell 1002, the hardmask 706a is left in place to protect RRAM cell 1002 during subsequent processing steps.

Figure 11:
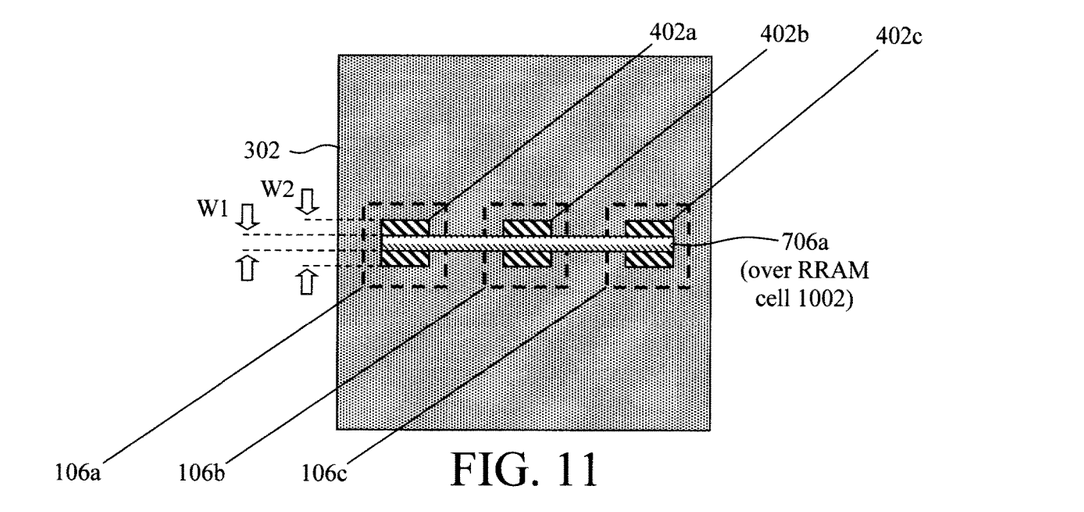
FIG. 11 is a top-down diagram illustrating that the RRAM cell is present over and in contact with each of the heating elements according to an embodiment of the present invention.
Figure 12:
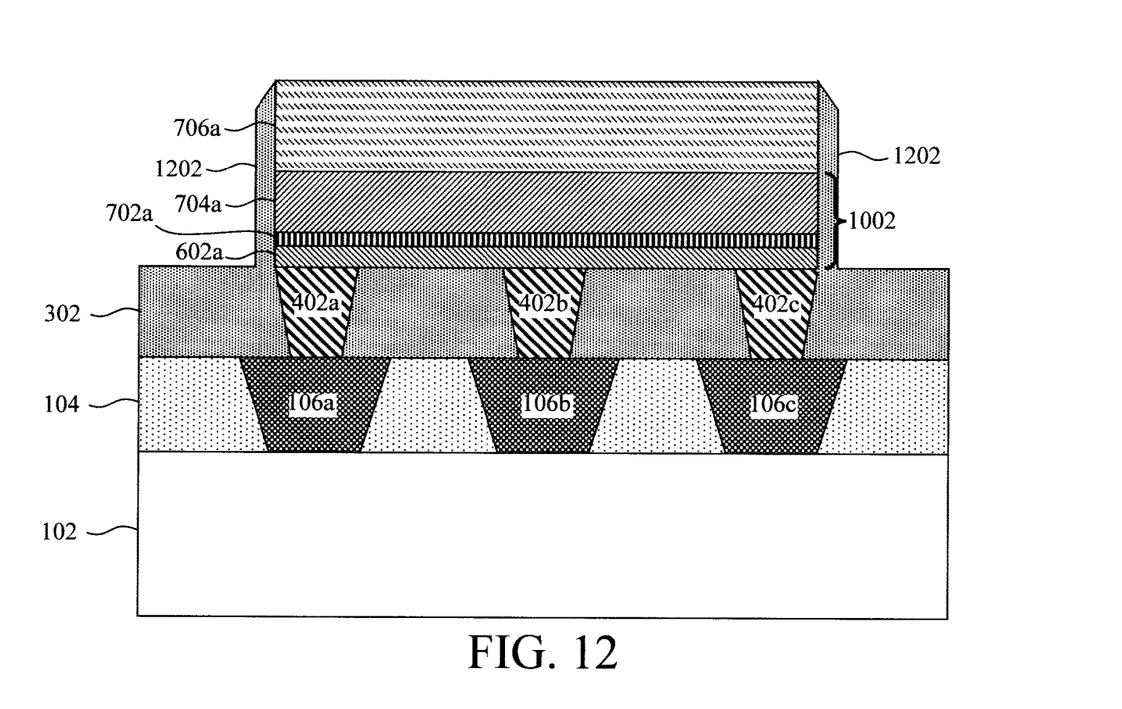
FIG. 12 is a cross-sectional diagram illustrating sidewall spacers having been formed along the sidewalls of the RRAM cell according to an embodiment of the present invention.
Figure 13:
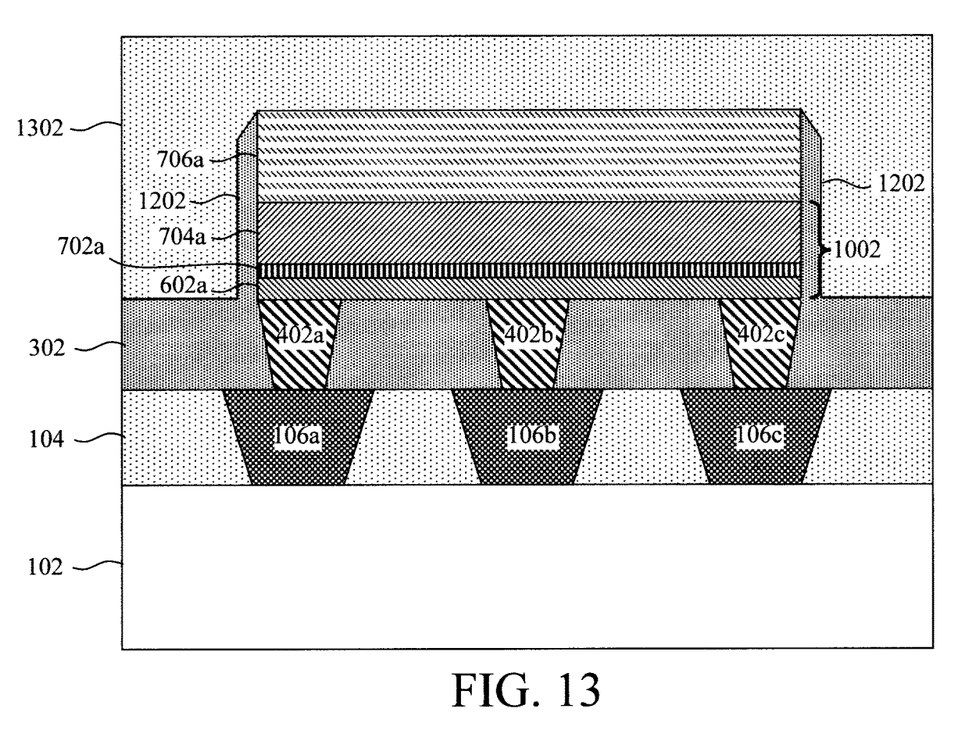
FIG. 13 is a cross-sectional diagram illustrating a dielectric layer having been deposited onto the capping layer over/burying the RRAM cell according to an embodiment of the present invention.

FIG. 11 is a diagram providing a top-down view of the device structure, e.g., from viewpoint D (see FIG. 10). As shown in FIG. 11, RRAM cell 1002 (present beneath hardmask 706a which is visible in this top-down view) is present over and in contact with each of the heating elements 402a,b,c. As shown in FIG. 11, according to an exemplary embodiment, hardmask 706a and underlying RRAM cell 1002 has a width W1, and the heating elements 402a,b,c have a width W2, wherein W2>W1. The wider heating elements 402a,b,c will insure efficient heating of the high-κ switching layer 702a.

In order to protect the sidewalls of the RRAM cell 1002 stack, sidewall spacers 1202 are next formed along the sidewalls of the RRAM cell 1002. See FIG. 12. According to an exemplary embodiment, sidewall spacers 1202 are formed by depositing a spacer material onto the RRAM cell 1002, and then performing an etch back of the spacer material to form the sidewall spacers 1202 shown in FIG. 12 along the sidewalls of the RRAM cell 1002 and alongside hardmask 706a. Suitable spacer materials include, but are not limited to, nitride materials such as SiN and/or SiCN. A process such as CVD, ALD or PVD can be used to deposit the spacer material. With the sidewall spacers 1202 in place, the RRAM cell 1002 is fully surrounded/protected, i.e., by capping layer 302 at its bottom and hardmask 706a at its top, and sidewall spacers 1202 along its sidewalls.

A dielectric is then deposited onto capping layer 302 over/burying the RRAM cell 1002 forming dielectric layer 1302. See FIG. 13. Dielectric layer 1302 may also be referred to herein as the "second dielectric layer" whereby dielectric layer 104 is the "first dielectric layer." Suitable materials for dielectric layer 1302 include, but are not limited to, nitride materials such as SiN and/or SiCN, and/or oxide low-κ materials such as SiOx and/or ULK-ILD materials such as pSiCOH. A process such as CVD, ALD or PVD can be employed to deposit the dielectric layer 1302. Following deposition, dielectric layer 1302 can be planarized using a process such as CMP. According to an exemplary embodiment, dielectric layer 1302 has a thickness of from about 10 nm to about 40 nm and ranges therebetween.

A contact 1402 to the top electrode 704a of RRAM cell 1002 is then formed in the dielectric layer 1302 and hardmask 706a. See FIG. 14. To form contact 1402 in dielectric layer 1302 and hardmask 706a, standard lithography and etching techniques (see above) are used to first pattern a feature (a vias and/or a trench) in dielectric layer 1302 and hardmask 706a. The feature is then filled with a contact metal (or combination of metals) to form contact 1402. A directional (anisotropic) etching process such as RIE (or a combination of RIE steps) can be employed for patterning the feature in dielectric layer 1302 and hardmask 706a, with the top electrode 704a of RRAM cell 1002 acting as an etch stop. Thus, contact 1402 is in direct contact with top electrode 704a of RRAM cell 1002. As will be described in detail below, during operation, contact 1402 along with at least one of the metal pads 106a,b,c will be used to provide a programming voltage to RRAM cell 1002.

Figure 14:
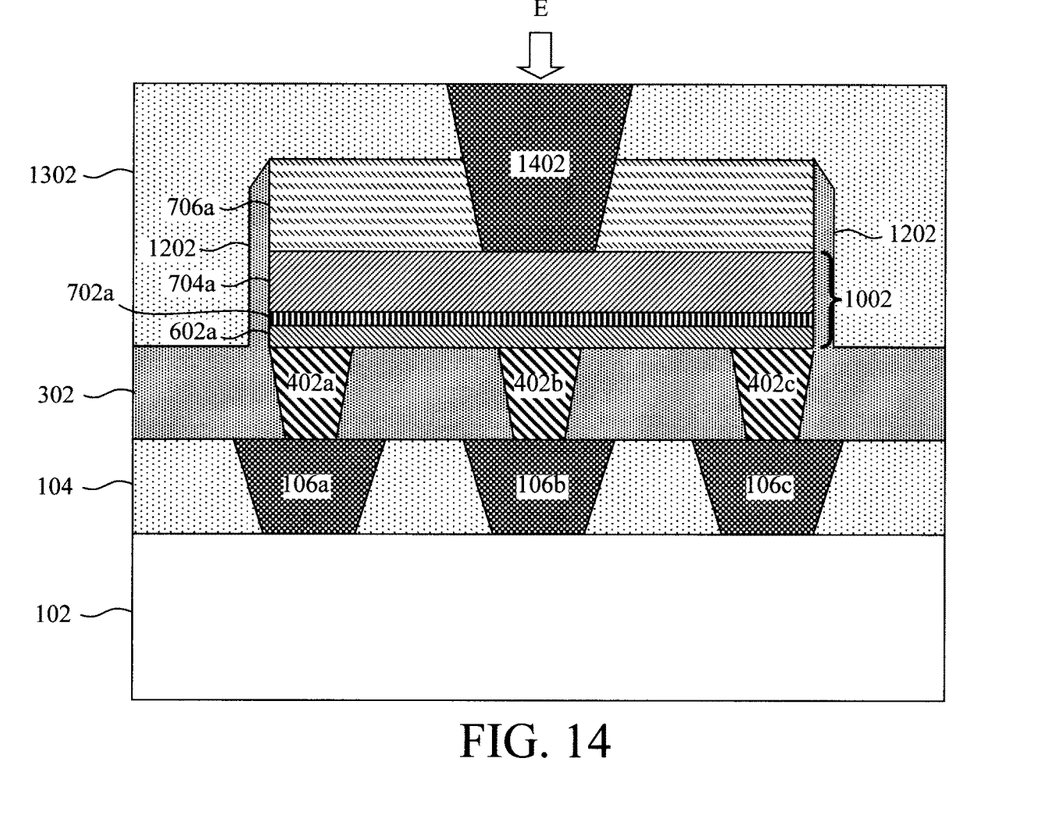
FIG. 14 is a cross-sectional diagram illustrating a contact to the top electrode of the RRAM cell having been formed in the dielectric layer and hardmask according to an embodiment of the present invention.

As provided above, suitable contact metals include, but are not limited to, Cu, W, Ru, Co, Ni and/or Pt. The contact metal(s) can be deposited into the features using a process such as evaporation, sputtering, or electrochemical plating. Following deposition, the metal overburden can be removed using a process such as CMP. Prior to depositing the contact metal(s) into the feature, a conformal barrier layer (not shown) can be deposited into and lining the feature. Use of such a barrier layer helps to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the features prior to contact metal deposition. A seed layer facilitates plating of the contact metal into the features.

Figure 15:
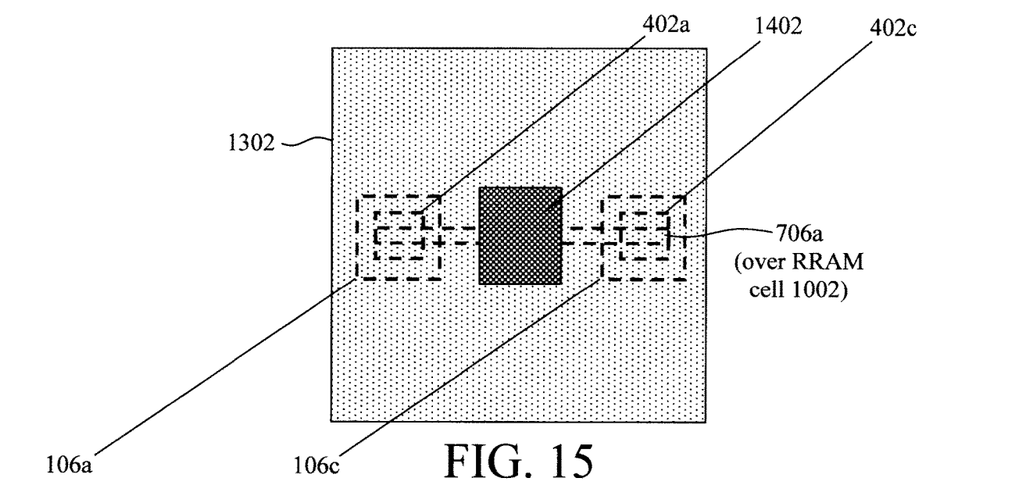
FIG. 15 is a top-down diagram illustrating the contact to the top electrode of the RRAM cell having been formed in the dielectric layer and hardmask according to an embodiment of the present invention.

FIG. 15 is a diagram providing a top-down view of the device structure, e.g., from viewpoint E (see FIG. 14). In FIG. 15, dotted lines are used to represent the metal pads 106a,b,c, heating elements 402a,b,c, and hardmask 706a (over RRAM cell 1002) which are now present beneath the dielectric layer 1302. As shown in FIG. 15, according to an exemplary embodiment contact 1402 is located in dielectric layer 1302 and hardmask 706a over a central metal pad and heating element, e.g., metal pad 106b and heating element 402b in this example. However, this configuration is merely a non-limiting example. For instance, contact 1402 could instead be located off to one side of the device and/or present over more than one of the metal pads and heating elements.

Figure 16:
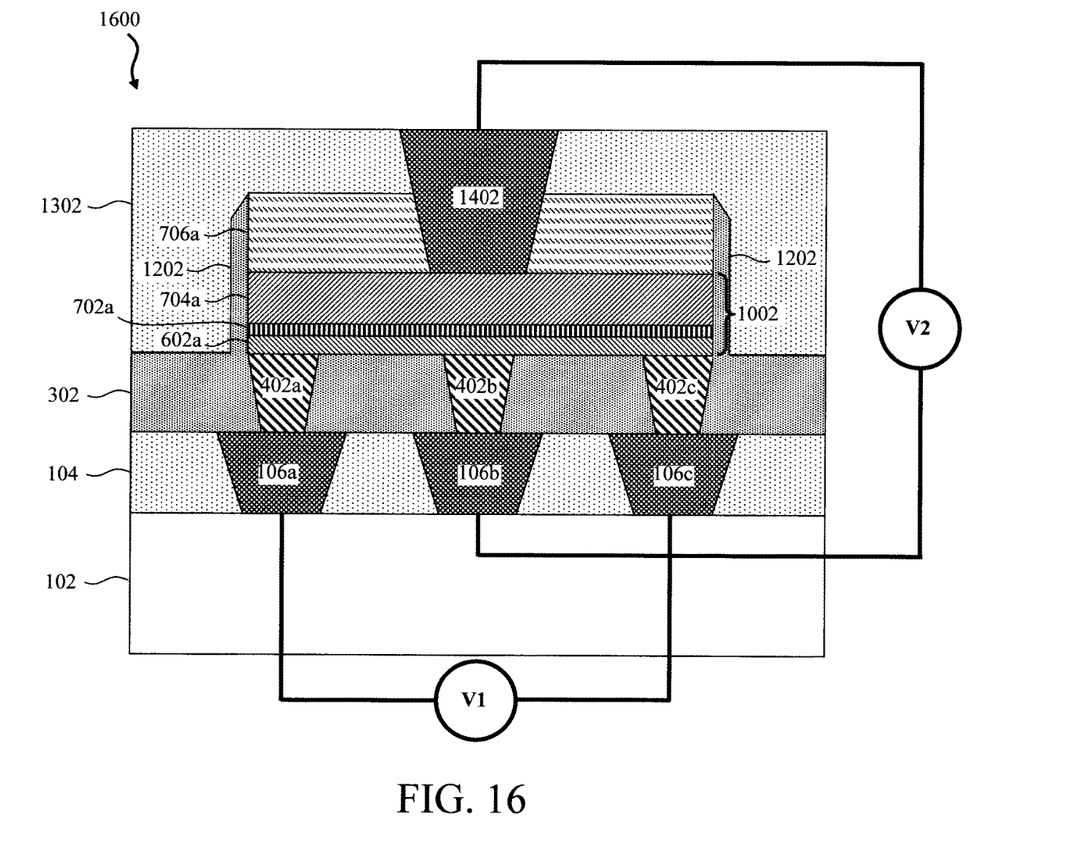
FIG. 16 is a cross-sectional diagram illustrating a first power supply V1 having been connected to one or more of the metal pads and a second power supply V2 having been connected to another one or more of the metal pads and to contact according to an embodiment of the present invention.

To complete the present RRAM device 1600, a first power supply V1 is connected to one or more of the metal pads 106a,b,c, and a second power supply V2 is connected to another one or more of the metal pads 106a,b,c and to contact 1402. See FIG. 16. Namely, during operation, heating elements 402a,b,c are used to locally heat the high-κ switching layer 702a (e.g., to a temperature of less than or equal to about 600° C.) to crystallize the high-κ switching layer 702a, and thereby lower the forming voltage (e.g., to less than about 1 volt (V)) of the high-κ switching layer 702a. As described above, heating elements 402a,b,c are resistive heating elements that generate heat using joule heating based on an applied voltage. Thus, as shown in FIG. 16, a first power supply V1 for joule heating is connected to at least two of the metal pads 106a,b,c beneath heating elements 402a,b,c. In the present example shown in FIG. 16, first power supply V1 is connected directly to the two outermost metal pads, i.e., metal pads 106a and 106c) beneath heating elements 402a and heating elements 402c, respectively. Doing so maximizes heating along the length of the high-κ switching layer 702a. However, this configuration is merely an example. For instance, more metal pads and/or heating elements can be employed in the design than shown, and the first power supply V1 can be connected to any two or more of the metal pads.

As provided above, heating elements 402a,b,c (and preferably the bottom electrode 602a) can be formed from a high resistivity metal such as TiN and/or TaN. Thus, an applied heating element voltage (via the first power supply V1 to the metal pads 106a, 106b and/or 106c) will cause the heating elements 402a,b,c and the bottom electrode 602a to generate heat by joule heating. This heat will crystallize the high-κ switching layer 702a which is in directed contact with the bottom electrode 602a. Advantageously, this heating will occur locally, proximal to the interface of the bottom electrode 602a and high-κ switching layer 702a. Thus, any impact on peripheral device structures by this heating process is avoided.

A second power supply V2 is used to provide an operational programming voltage to RRAM cell 1002. See FIG. 16. Preferably, the second power supply V2 is separate from first power supply V1. Namely, as shown in FIG. 16, second power supply V2 is connected to at least one of the metal pads 106a,b,c and to contact 1402. According to the exemplary embodiment depicted in FIG. 16, the second power supply V2 is connected to a different one of the metal pads (in this example metal pad 106b) than the first power supply V1 (which in this example is connected to metal pads 106a and 106c). This configuration enables the programming voltage to be applied at a center of the RRAM cell 1002. However, since the first power supply V1 and the second power supply V2 are separate from one another, and the heating element voltage and programming voltage will be applied in sequence (see below), the first and second power supplies V1 and V2 could be connected to the same metal pad(s) 106a, 106b and/or 106c.

An applied programming voltage by the second power supply V2 via contact 1402 to the top electrode 704a of RRAM cell 1002, and via metal pad(s) 106a, 106b and/or 106c and heating elements 402a, 402b and/or 402c to the bottom electrode 602a of RRAM cell 1002 will cause an electrically-conductive path or filament to form through the high-κ switching layer 702a. However, since the high-κ switching layer 702a has been crystallized (via the joule heating—see above), the forming voltage is lowered, e.g., to less than about 1V.

Figure 17:
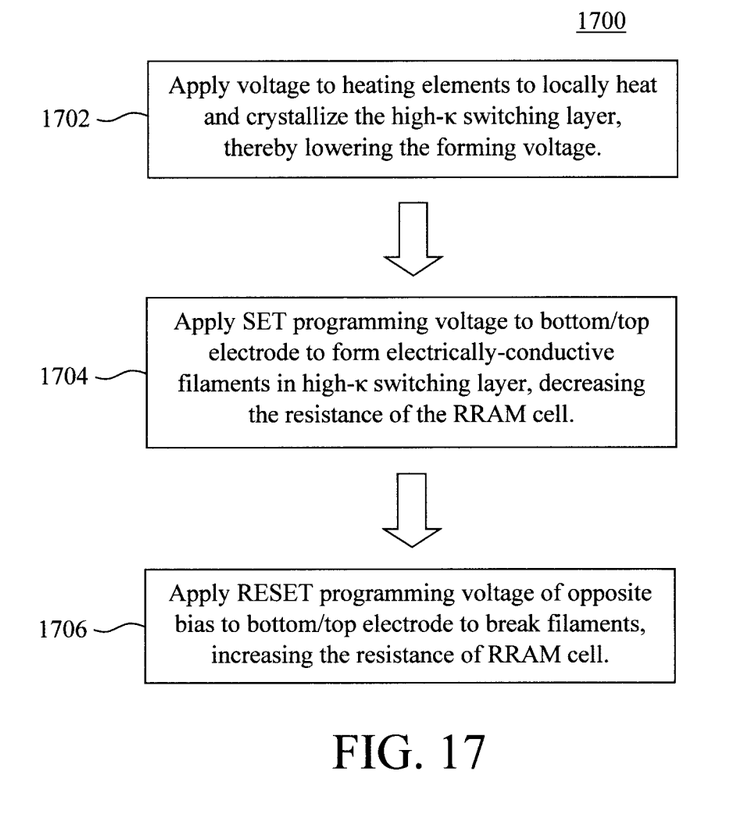
FIG. 17 is a diagram illustrating an exemplary methodology for operating the present RRAM device according to an embodiment of the present invention.

FIG. 17 is a diagram illustrating an exemplary methodology 1700 for operating RRAM device 1600. While the description of methodology 1700 references RRAM device 1600 shown in FIG. 16, the steps of methodology 1700 are generally applicable to any of the RRAM device configurations described herein.

In step 1702, a heating element voltage is applied (by first power supply V1) to the heating elements 402a,b,c and bottom electrode 602a via the metal pads 106a,b,c. As described in detail above, by way of joule heating, the heating elements 402a,b,c and bottom electrode 602a will in turn locally heat the high-κ switching layer 702a to crystallize the high-κ switching layer 702a, and thereby lower the forming voltage. According to an exemplary embodiment, the heating element voltage is from about 0.5 V to about 1 V and ranges therebetween, e.g., about 1V, which is applied for a duration of from about 0.1 nanoseconds (ns) to about 0.5 ns and ranges therebetween, e.g., about 0.2 ns, to heat the high-κ switching layer 702a to a temperature of from about 550° C. to about 650° C. and ranges therebetween, e.g., about 600° C.

The heating element voltage is removed and, in step 1704, a SET programming voltage is applied (by second power supply V2) to the bottom electrode 602a and the top electrode 704a via the metal pads 106a,b,c/heating elements 402a,b,c and the contact 1402, respectively, to program a resistance of the RRAM cell 1002. According to an exemplary embodiment, the SET programming voltage is from about 0.5 V to about 1 V and ranges therebetween, e.g., about 1V, which is applied for a duration of from about 0.1 ns to about 0.5 ns and ranges therebetween, e.g., about 0.2 ns. Application of a positive bias in this manner will cause ions from the bottom electrode 602a to migrate through high-κ switching layer 702a toward top electrode 704a forming electrically-conductive filaments in high-κ switching layer 702a, decreasing the resistance of RRAM cell 1002. This operation is also referred to herein as a 'SET' process. Advantageously, since the high-κ switching layer 702a has been crystallized (via the joule heating—see above), the forming voltage is lowered, e.g., to less than about 1V.

Reversing the bias causes the filaments to break or rupture, increasing the resistance of RRAM cell 1002. See step 1706. This operation is also referred to herein as a 'RESET' process. For the RESET process, a RESET programming voltage is applied (by second power supply V2) to the bottom electrode 602a and the top electrode 704a via the metal pads 106a,b,c/heating elements 402a,b,c and the contact 1402, respectively. According to an exemplary embodiment, the RESET programming voltage is from about −1 V to about −0.5 V and ranges therebetween, e.g., about −1V, which is applied for a duration of from about 0.1 ns to about 0.5 ns and ranges therebetween, e.g., about 0.2 ns.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a resistive random access memory (RRAM) device, the method comprising the steps of:
depositing a first dielectric layer on a substrate;
forming metal pads in the first dielectric layer over the substrate;
depositing a capping layer onto the first dielectric layer, covering the metal pads;
forming heating elements in the capping layer over and in contact with the metal pads;
forming an RRAM stack on the capping layer comprising a bottom electrode layer disposed on the capping layer, a high-κ dielectric layer disposed on the bottom electrode layer, and a top electrode layer disposed on the high-κ dielectric layer;
forming a patterned hardmask layer on the RRAM stack;
patterning the RRAM stack into at least one RRAM cell on the capping layer using the patterned hardmask, the at least one RRAM cell comprising a bottom electrode, a high-κ switching layer disposed on the bottom electrode, and a top electrode disposed on the high-κ switching layer;
depositing a second dielectric layer over the at least one RRAM cell; and
forming a contact to the top electrode in the second dielectric layer.

2. The method of claim 1, wherein the metal pads comprise a metal selected from the group consisting of: copper (Cu), tungsten (W), ruthenium (Ru), cobalt (Co), nickel (Ni), platinum (Pt), and combinations thereof.

3. The method of claim 1, wherein the capping layer comprises a material selected from the group consisting of: silicon nitride (SiN), silicon carbon nitride (SiCN), and combinations thereof.

4. The method of claim 1, wherein the heating elements comprise a high resistivity metal selected from the group consisting of: titanium nitride (TiN), tantalum nitride (TaN), and combinations thereof.

5. The method of claim 1, wherein the bottom electrode layer comprises a high resistivity metal selected from the group consisting of: TiN, TaN, and combinations thereof.

6. The method of claim 1, wherein the high-κ dielectric layer comprises a material selected from the group consisting of: hafnium oxide ($HfO_2$), lanthanum oxide ($LaO_2$), strontium titanate ($SrTiO_3$), and combinations thereof.

7. The method of claim 1, wherein the top electrode layer comprises a material selected from the group consisting of: TiN having a titanium to nitrogen (Ti/N) ratio of greater than 1, tungsten titanium (TiW), titanium aluminum carbide (TiAlC), and combinations thereof.

8. The method of claim 1, further comprising the step of:
forming sidewall spacers along sidewalls of the at least one RRAM cell.

9. The method of claim 8, wherein the sidewall spacers comprise a material selected from the group consisting of: SiN, SiCN, and combinations thereof.

10. The method of claim 1, further comprising the steps of:
connecting a first power supply to one or more of the metal pads; and
connecting a second power supply to another one more of the metal pads and to the contact, wherein the first power supply and the second power supply are separate from one another.

11. An RRAM device, comprising:
a first dielectric layer disposed on a substrate;
metal pads present in the first dielectric layer over the substrate;
a capping layer disposed on the first dielectric layer, covering the metal pads;
heating elements present in the capping layer over and in contact with the metal pads;

at least one RRAM cell on the capping layer, the at least one RRAM cell comprising a bottom electrode, a high-κ switching layer disposed on the bottom electrode, and a top electrode disposed on the high-κ switching layer;

a second dielectric layer disposed over the at least one RRAM cell; and a contact to the top electrode present in the second dielectric layer.

12. The RRAM device of claim 11, wherein the heating elements comprise a high resistivity metal selected from the group consisting of: TiN, TaN, and combinations thereof.

13. The RRAM device of claim 11, wherein the bottom electrode layer comprises a high resistivity metal selected from the group consisting of: TiN, TaN, and combinations thereof.

14. The RRAM device of claim 11, wherein the high-κ dielectric layer comprises a material selected from the group consisting of: $HfO_2$, $LaO_2$, $SrTiO_3$, and combinations thereof.

15. The RRAM device of claim 11, wherein the top electrode layer comprises a material selected from the group consisting of: TiN having a Ti/N ratio of greater than 1, TiW, TiAlC, and combinations thereof.

16. The RRAM device of claim 11, further comprising:
sidewall spacers disposed along sidewalls of the at least one RRAM cell.

17. The RRAM device of claim 11, further comprising:
a patterned hardmask disposed on the at least one RRAM cell.

18. The RRAM device of claim 11, further comprising:
a first power supply connected to one or more of the metal pads; and
a second power supply connected to another one more of the metal pads and to the contact, wherein the first power supply and the second power supply are separate from one another.

19. A method of operating an RRAM device, the method comprising the steps of:
providing the RRAM device comprising:
a first dielectric layer disposed on a substrate;
metal pads formed in the first dielectric layer over the substrate;
a capping layer disposed on the first dielectric layer, covering the metal pads;
heating elements formed in the capping layer over and in contact with the metal pads;
at least one RRAM cell on the capping layer, the at least one RRAM cell comprising a bottom electrode, a high-κ switching layer disposed on the bottom electrode, and a top electrode disposed on the high-κ switching layer;
a second dielectric layer disposed over the at least one RRAM cell;
a contact to the top electrode formed in the second dielectric layer;
applying a voltage to the heating elements to locally heat and crystallize the high-κ switching layer; and
applying a programming voltage to the bottom electrode and the top electrode to program a resistance of the at least one RRAM cell.

20. The method of claim 19, wherein the RRAM device further comprises a first power supply connected to one or more of the metal pads, and a second power supply connected to another one more of the metal pads and to the contact, wherein the first power supply and the second power supply are separate from one another, wherein the voltage is applied to the heating elements using the first power supply, and wherein the programming voltage is applied to the bottom electrode and the top electrode using the second power supply.

* * * * *